United States Patent
Fudeta

(10) Patent No.: US 8,319,243 B2
(45) Date of Patent: Nov. 27, 2012

(54) NITRIDE SEMICONDUCTOR LIGHT-EMITTING DEVICE AND METHOD OF MANUFACTURING THE SAME

(75) Inventor: Mayuko Fudeta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/317,102

(22) Filed: Oct. 11, 2011

(65) Prior Publication Data

US 2012/0032144 A1 Feb. 9, 2012

Related U.S. Application Data

(63) Continuation of application No. 12/461,184, filed on Aug. 4, 2009, now Pat. No. 8,063,410.

(30) Foreign Application Priority Data

Aug. 5, 2008 (JP) ................................ 2008-201971

(51) Int. Cl.
*H01L 33/04* (2010.01)
*H01L 33/60* (2010.01)

(52) U.S. Cl. ............ 257/98; 257/13; 257/E33.008; 257/E33.064; 257/E33.72; 438/29

(58) Field of Classification Search ............ 257/13, 257/98, 103, E33.067, E33.061, E33.064, 257/E33.072, E33.008; 438/29
See application file for complete search history.

(56) References Cited

U.S. PATENT DOCUMENTS

| 6,191,436 | B1 | 2/2001 | Shibata et al. |
| 6,455,340 | B1 | 9/2002 | Chua et al. |
| 6,573,114 | B1 | 6/2003 | Shibata et al. |
| 6,756,732 | B1 | 6/2004 | Kawase |
| 2003/0122251 | A1 | 7/2003 | Shibata et al. |
| 2005/0023549 | A1 | 2/2005 | Gardner et al. |
| 2005/0079642 | A1 | 4/2005 | Tamura |
| 2005/0104080 | A1 | 5/2005 | Ichihara et al. |
| 2006/0033113 | A1 | 2/2006 | Lee et al. |
| 2008/0217648 | A1 | 9/2008 | Ohara |

(Continued)

FOREIGN PATENT DOCUMENTS

CN 1346519 4/2002

(Continued)

OTHER PUBLICATIONS

Office Action dated Dec. 16, 2010 in corresponding Chinese Patent Application No. 200910165303 with English translation thereof.

*Primary Examiner* — Evan Pert
*Assistant Examiner* — Whitney T Moore
(74) *Attorney, Agent, or Firm* — Harness, Dickey & Pierce, P.L.C.

(57) ABSTRACT

A nitride semiconductor light-emitting device including a reflecting layer made of a dielectric material, a transparent conductive layer, a p-type nitride semiconductor layer, a light emitting layer and an n-type nitride semiconductor layer in this order and a method of manufacturing the same are provided. The transparent conductive layer is preferably made of a conductive metal oxide or an n-type nitride semiconductor, and the reflecting layer made of a dielectric material preferably has a multilayer structure obtained by alternately stacking a layer made of a dielectric material having a high refractive index and a layer made of a dielectric material having a low refractive index.

23 Claims, 9 Drawing Sheets

U.S. PATENT DOCUMENTS

2011/0018024 A1 * 1/2011 Fukshima et al. ............. 257/98

FOREIGN PATENT DOCUMENTS

| | | |
|---|---|---|
| CN | 1734798 | 2/2006 |
| JP | 8-250768 | 9/1996 |
| JP | 2001-244503 | 9/2001 |
| JP | 2003-234542 | 8/2003 |
| JP | 2004-119831 | 4/2004 |
| JP | 2005-142532 | 6/2005 |
| JP | 2006-054420 | 2/2006 |
| JP | 2007-180302 | 7/2007 |
| JP | 2007-258276 | 10/2007 |
| JP | 2007-536725 T | 12/2007 |
| JP | 2008-506259 T | 2/2008 |
| WO | WO 01/39286 | 5/2001 |
| WO | WO 2005/050748 | 6/2005 |
| WO | WO 2005/104780 | 11/2005 |
| WO | WO 2006/014421 | 2/2006 |

* cited by examiner

NITRIDE SEMICONDUCTOR LIGHT-EMITTING DEVICE AND METHOD OF MANUFACTURING THE SAME

CROSS-REFERENCE TO RELATED APPLICATIONS

This nonprovisional application is a continuation under 35 U.S.C. §120 of U.S. application Ser. No. 12/461,184, filed Aug. 4, 2009, now U.S. Pat. No. 8,063,410, which claims priority under 35 U.S.C. §119 to Japanese Patent Application No. 2008-201971, filed on Aug. 5, 2008 with the Japan Patent Office, the entire contents of each of which are hereby incorporated herein by reference.

BACKGROUND

1. Technical Field

The present invention relates to a nitride semiconductor light-emitting device and a method of manufacturing the same.

2. Description of the Related Art

A nitride semiconductor light-emitting device having a one-side two-electrode structure obtained by stacking an n-type nitride semiconductor layer, a light emitting layer, a p-type nitride semiconductor layer and the like on an insulating sapphire substrate and arranging a p-side electrode and an n-side electrode on such a multilayer structure is known in general. In the nitride semiconductor light-emitting device having such a one-side two-electrode structure, however, the electrodes are not formed on symmetrical positions of the upper and lower surfaces of the chip, and hence luminous intensity is not uniformized in plane, but emission concentrates on the p-side electrode or the n-side electrode. Further, it is difficult to increase the size of the chip and the chip is easily deteriorated by aging due to the aforementioned problem. In addition, the pad electrodes provided on one surface occupy large ratios in the surface area of the chip, and it is also difficult to reduce the size of the chip.

In order to solve the aforementioned problems, Japanese Patent Laying-Open No. 2001-244503, for example, proposes a method of manufacturing a nitride semiconductor light-emitting device including the steps of successively growing an n layer made of a gallium nitride-based semiconductor, a gallium nitride-based semiconductor active layer and a p layer made of a gallium nitride-based semiconductor on a substrate, successively forming a p-side ohmic electrode such as an Ni—Pt electrode, for example, and a first conductive adhesive layer made of Au—Sn on the p layer, bonding a conductive substrate prepared by successively forming a layer made of Au and a second conductive adhesive layer made of Au—Sn to the above-mentioned substrate by bonding the second conductive adhesive layer and the first conductive adhesive layer to each other and separating the substrate and a nitride semiconductor light-emitting device having a vertical electrode structure obtained by this method. In the nitride semiconductor light-emitting device described in this document, however, light extraction efficiency is inferior due to low reflectance of the electrode.

A structure employing a distributed Bragg reflector (DBR) is known as a device structure for improving light extraction efficiency. For example, National Patent Publication Gazette No. 2007-536725 discloses a method of manufacturing a semiconductor device by forming an n-type GaN layer, a multiple quantum well (MQW) layer and a p-type GaN layer on a sapphire substrate in this order, thereafter forming a p-type contact layer on the p-type GaN layer with a p-type contact metal such as Ni/Au, forming a DBR layer made of indium tin oxide (ITO) thereon and thereafter forming a support substrate by plating. In this structure, however, the light extraction efficiency is not sufficiently improved due to large light absorption by the contact metal such as Ni/Au. Further, while light absorption by ITO is negligible when the thickness of the DBR layer is about 300 nm, the light extraction efficiency may be insufficiently improved due to large light absorption if a thick film such as a multilayer film is prepared from ITO in order to form the DBR layer. While this document discloses no specific method of preparing the DBR layer from ITO, it is difficult to increase refractive index difference if a low refractive index layer is made of a material identical to that for a high refractive index layer, and the reflectance of the DBR layer made of ITO cannot be increased as a result.

Japanese Patent Laying-Open No. 2003-234542 discloses a nitride-based resonator semiconductor structure including a DBR, having a dielectric layer obtained by alternately stacking an $SiO_2$ layer and a $Ta_2O_5$ layer, formed on a p-type contact layer with a thickness of a quarter wavelength. A support substrate is mounted on the DBR, a growth substrate is removed, an n-type layer and an active layer are thereafter removed by dry etching to expose the p-type layer, and a p-type electrode is formed on the exposed p-type layer. In the semiconductor structure described in this document, the dielectric layer having high reflectance is directly formed on the overall surface of the p-type contact layer, and hence a surface of the p-type contact layer opposite to the dielectric layer must be partially exposed for forming the p-type electrode thereon. However, a p-type nitride semiconductor layer has extremely high resistance, as sufficiently known in this technical field. Therefore, a current cannot laterally diffuse from the portion provided with the electrode. Even if the current slightly diffuses, resistance is extremely increased. Further, two electrodes must be formed on one side in this structure, to result in problems identical to the above.

A vertical resonator surface emission laser device disclosed in Japanese Patent Laying-Open No. 2004-119831 includes a DBR, consisting of a quarter-wavelength multilayer semiconductor structure of Si-doped n-type AlAs/AlGaAs, formed on a semiconductor substrate made of n-type GaAs. In order to implement a DBR having a structure similar to that of this DBR in a nitride semiconductor light-emitting device, a GaN substrate or an SiN substrate is generally employed as a conductive substrate. However, both of GaN and SiN are extremely high-priced and not suitable for a low-priced LED. In order to form the DBR by a multilayer structure of GaN and AlGaN formable by epitaxy on the GaN or SiN substrate, the layers must be extremely multicyclically grown due to small refractive index difference, and it is difficult to construct the DBR due to cracking or the like. In addition, the quality of an active layer grown on such a DBR is so inferior that internal quantum efficiency is reduced.

National Patent Publication Gazette No. 2008-506259 discloses a technique of forming a DBR consisting of conductive ZnSSe and an Mgs/ZnCdSe superlattice on a conductive GaAs substrate and welding the DBR to a nitride semiconductor layer provided on a sapphire substrate by wafer bonding. When the welding is performed without employing an adhesive, however, the surfaces of both wafers must indispensably be planar, and the wafer bonding cannot be performed if the surface of either wafer is slightly irregularized. In the case of an actual nitride semiconductor, waste or the like coming off a reactor frequently adheres to the surface of an epiwafer during epitaxy, and it is difficult to completely remove waste from the wafer.

Japanese Patent Laying-Open No. 2006-054420 discloses a light-emitting device having no vertical electrode structure but including a mesh DBR reflecting layer formed on a p layer of a flip chip light-emitting device and a contact electrode formed on a portion not provided with the mesh DBR reflecting layer. The mesh DBR reflecting layer is made of a nitride semiconductor. However, it is difficult to prepare a DBR from a nitride semiconductor as hereinabove described, and even if such a DBR can be prepared, no current is injected into a DBR region due to high resistance, and an injection area is reduced. Consequently, the current density is increased to reduce luminous efficiency. If the contact electrode portion has low reflectance, light extraction efficiency is also reduced. While this document lists Ag, Ni, Al, Ph, Pd, Ir, Ru, Mg, Zn, Pt, Au etc. as exemplary materials for an ohmic contact layer, these materials have low reflectance except Ag and Al. Al having high reflectance cannot be brought into ohmic contact with a p-type semiconductor layer, but increases resistance. If Ag is employed as the material for the ohmic contact layer, electromigration takes place to cause a short circuit upon migration to an n side, and hence this structure is extremely problematic in reliability.

As hereinabove described, there has hitherto been implemented no nitride semiconductor light-emitting device excellent in internal quantum efficiency, light extraction efficiency and driving voltage as well as in mass productivity.

SUMMARY

The present invention has been proposed in consideration of the aforementioned problems, and an object thereof is to provide a nitride semiconductor light-emitting device capable of employing a vertical electrode structure and excellent in internal quantum efficiency, light extraction efficiency and driving voltage as well as in mass productivity and a method of manufacturing the same.

The present invention provides a nitride semiconductor light-emitting device including a reflecting layer made of a dielectric material, a transparent conductive layer, a p-type nitride semiconductor layer, a light emitting layer and an n-type nitride semiconductor layer in this order, and a nitride semiconductor light-emitting device including a support substrate, a reflecting layer made of a dielectric material, a transparent conductive layer, a p-type nitride semiconductor layer, a light emitting layer and a n-type nitride semiconductor layer in this order.

The transparent conductive layer is preferably made of a conductive metal oxide or an n-type nitride semiconductor. The reflecting layer made of a dielectric material preferably has a multilayer structure obtained by alternately stacking a layer made of a dielectric material having a high refractive index and a layer made of a dielectric material having a low refractive index. The reflecting layer made of a dielectric material preferably has reflectance of 80 to 100% with respect to light emitted from the light emitting layer. The thickness of the reflecting layer made of a dielectric material is preferably set to 0.2 to 5 μm.

The surface on the side provided with the reflecting layer made of a dielectric material is preferably planar in the surfaces of a nitride semiconductor layer consisting of the p-type nitride semiconductor layer, the light emitting layer and the n-type nitride semiconductor layer, and the surface opposite to the side provided with the reflecting layer made of a dielectric material is preferably irregularized in the surfaces of the nitride semiconductor layer.

In the nitride semiconductor light-emitting device according to the present invention, the length of the transparent conductive layer in a direction perpendicular to the thickness direction is preferably rendered smaller than the length of the p-type nitride semiconductor layer in a direction perpendicular to the thickness direction, and the reflecting layer made of a dielectric material is preferably in contact with both side surfaces of the transparent conductive layer and a surface of the transparent conductive layer closer to the reflecting layer made of a dielectric material and further in contact with a part of a surface of the p-type nitride semiconductor layer closer to the transparent conductive layer. The part of a surface is a surface which is not in contact with the transparent conductive layer.

The reflecting layer made of a dielectric material preferably has a through-port passing through the reflecting layer in the thickness direction in a region located immediately under the transparent conductive layer. The p-type nitride semiconductor layer preferably includes a current blocking region formed in contact with the transparent conductive layer. In this case, the through-port provided in the reflecting layer made of a dielectric material is preferably positioned immediately under the current blocking region.

The nitride semiconductor light-emitting device according to the present invention may have a eutectic bonding layer of a single- or multilayer structure made of a metal including a eutectic bonding metal or an alloy containing the same between the support substrate and the reflecting layer made of a dielectric material. The nitride semiconductor light-emitting device may have an adhesion layer between the reflecting layer made of a dielectric material and the eutectic bonding layer. The support substrate may be a substrate made of a plated metal or alloy.

The present invention also provides a method of manufacturing a nitride semiconductor light-emitting device including a support substrate, a reflecting layer made of a dielectric material, a transparent conductive layer, a p-type nitride semiconductor layer, a light emitting layer and an n-type nitride semiconductor layer in this order, including the steps of (A) stacking the n-type nitride semiconductor layer, the light emitting layer and the p-type nitride semiconductor layer on a growth substrate in this order, (B) forming the transparent conductive layer on the surface of the p-type nitride semiconductor layer, (C) forming the reflecting layer made of a dielectric material on an exposed surface of an obtained laminate, (D) stacking the support substrate, (E) removing the growth substrate, and (F) obtaining a plurality of nitride semiconductor light-emitting devices by performing chip division.

The method of manufacturing a nitride semiconductor light-emitting device according to the present invention preferably further includes a step (G) of partially exposing the transparent conductive layer by forming a through-port passing through the reflecting layer in the thickness direction in the reflecting layer made of a dielectric material after the step (C). In this case, the through-port is preferably formed by etching, and the transparent conductive layer preferably functions as an etching stopper layer in etching. Further, the method of manufacturing a nitride semiconductor light-emitting device preferably further includes a step (H) of exposing the reflecting layer made of a dielectric material by forming recesses substantially at a constant interval from the side of the n-type nitride semiconductor layer between the steps (E) and (F).

The method of manufacturing a nitride semiconductor light-emitting device according to the present invention preferably further includes a step (I) of irregularizing the surface of the n-type nitride semiconductor layer after the step (E).

When forming the aforementioned recesses, the chip division is preferably performed on any positions on the bottom surfaces of the recesses in the step (F).

According to the present invention, a nitride semiconductor light-emitting device of a vertical electrode structure or a one-side two-electrode structure excellent in internal quantum efficiency, light extraction efficiency and driving voltage as well as in mass productivity can be provided.

The foregoing and other objects, features, aspects and advantages of the present invention will become more apparent from the following detailed description of the present invention when taken in conjunction with the accompanying drawings.

DETAILED DESCRIPTION

Embodiments of the present invention are now described in detail with reference to the drawings.

<First Embodiment>

Figure 1:
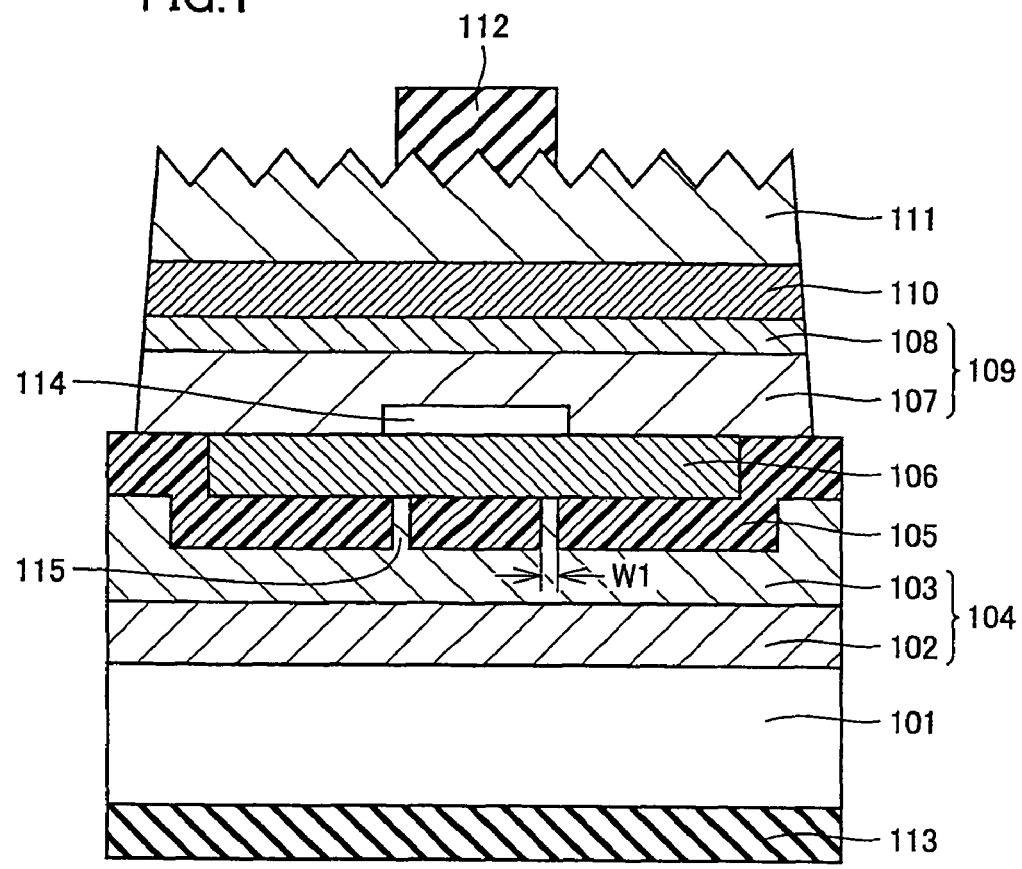
FIG. 1 is a schematic sectional view showing a first embodiment of a nitride semiconductor light-emitting device according to the present invention.

FIG. 1 is a schematic sectional view showing a first embodiment of a nitride semiconductor light-emitting device according to the present invention. The nitride semiconductor light-emitting device shown in FIG. 1 has a multilayer structure obtained by stacking a support substrate 101; a eutectic bonding layer 104 consisting of a second bonding layer 102 and a first bonding layer 103; a reflecting layer 105 made of dielectric materials; a transparent conductive layer 106; a p-type nitride semiconductor layer 109 consisting of a p-type GaN layer 107 and a p-type AlGaN layer 108; a light emitting layer 110; and an n-type nitride semiconductor layer 111 made of n-GaN in this order. A first electrode (n-side electrode) 112 is formed on the n-type nitride semiconductor layer 111 while a second electrode (p-side electrode) 113 is formed on a surface of the support substrate 101 opposite to the eutectic bonding layer 104, so that the nitride semiconductor light-emitting device has a vertical electrode structure.

Thus, the nitride semiconductor light-emitting device according to the first embodiment includes a multilayer structure of the reflecting layer 105 made of dielectric materials and the transparent conductive layer 106 between the support substrate 101 and the p-type nitride semiconductor layer 109. According to this structure, a current can be efficiently injected into the overall light-emitting device through the transparent conductive layer 106, whereby resistance can be reduced. Further, light emitted from the light emitting layer 110 toward the support substrate 101 can be efficiently reflected by the reflecting layer 105 made of dielectric materials, whereby light extraction efficiency can be improved. While the quality of an active layer grown on a DBR is reduced to reduce internal quantum efficiency when the DBR is prepared by crystal growth, a DBR according to the present invention exerts no influence on crystals. In other words, crystal growth can be performed with a layer structure and growth conditions improving crystal quality according to the present invention, whereby internal quantum efficiency can be increased. Further, the transparent conductive layer 106 is formed substantially on the overall surface of the p-type GaN layer 107, whereby resistance is not increased but a driving voltage can be reduced, dissimilarly to a case of partially exposing a p-type layer and forming an electrode on the exposed portion as described in Japanese Patent Laying-Open No. 2003-234542.

The reflecting layer 105, not particularly restricted so far as the same is constituted of a dielectric material and has excellent reflectance with respect to the light emitted from the light emitting layer 110, preferably has a multilayer structure obtained by alternately stacking a layer made of a dielectric material having a high refractive index and a layer made of a dielectric material having a low refractive index, so that the reflecting layer 105 has high reflectance with respect to the emitted light. The dielectric material having a high refractive index is a dielectric material having a refractive index of about 1.7 to 3, preferably about 2 to 3 at an emission wavelength of 450 nm of the emitted light, such as SiN (having a refractive index of 2.1), $TiO_2$ (having a refractive index of 2.4 to 3), GaN (having a refractive index of 2.4), $Ta_2O_3$ or $Ta_2O_5$ (having a refractive index of 2.2 to 2.3), $Nb_2O_5$ (having a refractive index of 2.3), ZrO, $ZrO_2$, CeO, $Al_2O_3$ or $CeF_3$, for example. The dielectric material having a low refractive index is a dielectric material having a refractive index of about 1 to 2, preferably about 1 to 1.8 at the emission wavelength of 450 nm of the emitted light, such as $SiO_2$ (having a refractive index of 1.47), $MgF_2$ (having a refractive index of 1.38), $CaF_2$ (having a refractive index of 1.43), $Al_2O_3$ or $CeF_3$, for example. $Al_2O_3$ or $CeF_3$ having an intermediate refractive index can be employed for both of the layers having a high refractive index and the layers having a low refractive index. When the reflecting layer 105 has the multilayer structure obtained by alternately stacking the layer made of a dielectric material having a high refractive index and the layer made of a dielectric material having a low refractive index, the dielectric materials are so selected that the refractive index of the former is larger than that of the latter.

Assuming that one layer made of a dielectric material having a high refractive index and one layer made of a dielectric material having a low refractive index form one period, the number of periods of the multilayer structure included in the reflecting layer 105 is not particularly restricted. In consideration of improvement in reflectance, layers closer to the support substrate 101 and the transparent conductive layer 106 shown as the lowermost and uppermost layers in FIG. 1 respectively are preferably formed by the layer made of a dielectric material having a high refractive index and the layer made of a dielectric material having a low refractive index respectively.

In order to attain more excellent reflectivity with respect to light vertically incident upon the reflecting layer 105, the thickness of each of the layers made of dielectric materials having high and low refractive indices constituting the reflecting layer 105 is preferably set as follows:

Wavelength [nm] of light incident upon reflecting layer (wavelength [nm] of light emitted from light emitting layer)× (refractive index of layer)/4 [nm]

When the layer made of a dielectric material having a high refractive index are made of SiN and the wavelength of the light emitted from the light emitting layer 110 is 450 nm, for example, the thickness of the layer made of SiN is preferably set to about 53 nm.

In order to attain excellent reflectance also with respect to light obliquely incident upon the reflecting layer 105, the reflecting layer 105 may further include a multilayer structure portion constituted of layers made of dielectric materials having high and low refractive indices respectively with thicknesses different from the above, in addition to a multilayer structure portion constituted of layers having thicknesses calculated from the above formula.

The total thickness of the reflecting layer 105, depending on the number of periods of the multilayer structure and not particularly restricted, can be set to 0.2 to 5 nm, for example. While a method of manufacturing a nitride semiconductor light-emitting device according to the present invention described later preferably includes a step of forming recesses reaching the reflecting layer 105 by etching (dry etching, for example) from the side of the n-type nitride semiconductor layer 111, the reflecting layer 105 preferably functions as an etching stopper layer in this etching and the thickness of the reflecting layer 105 is preferably set to 0.2 to 5 nm, so that the reflecting layer 105 functions as the etching stopper layer.

The reflecting layer 105 preferably has reflectance of 80 to 100%, preferably 90 to 100% with respect to the light emitted from the light emitting layer 110.

The transparent conductive layer 106, stacked on the aforementioned reflecting layer 105 made of dielectric materials, is preferably made of a material having excellent conductivity. A conductive metal oxide such as ITO (indium tin oxide), IZO (indium zinc oxide) or $In_2O_3$ (indium oxide), for example, can be employed as such a conductive material. Alternatively, an n-type nitride semiconductor (n-type $Al_xIn_yGa_{1-x-y}N$ ($0 \leq x \leq 1$ and $0 \leq y \leq 1$), for example) may be employed. The n-type nitride semiconductor is advantageously employed in such points that a film thereof can be continuously grown in an MOCVD apparatus and the same has higher transmittance with respect to the light of 450 nm in wavelength as compared with ITO or the like. The thickness of the transparent conductive layer 106, not particularly restricted, can be set to 50 to 1000 nm, for example, and is preferably 80 to 500 nm in consideration of improvement in transmittance.

According to the first embodiment, the lateral length (length in a direction perpendicular to the thickness direction) of the transparent conductive layer 106 is rendered smaller than the lateral length (length in a direction perpendicular to the thickness direction) of the p-type nitride semiconductor layer 109, more specifically the p-type GaN layer 107; stacked thereon, so that the reflecting layer 105 covers both side surfaces of the transparent conductive layer 106 and the surface closer to the reflecting layer 105. The reflecting layer 105 is formed to be in contact with portions not in contact with the transparent conductive layer 106 in the surface of the p-type GaN layer 107 closer to the transparent conductive layer 106. According to this structure, end portions of the transparent conductive layer 106 and a P-N junction can preferably be separated from each other, for preventing leakage. Further, the reflecting layer 105 made of dielectric materials can preferably function as the etching stopper layer in the dry etching for forming the recesses for chip division.

The nitride semiconductor light-emitting device according to the first embodiment has a current blocking region 114 formed in the p-type GaN layer 107 to be in contact with the transparent conductive layer 106. Reduction in light extraction efficiency can be prevented by forming the current blocking region 114 and arranging the first electrode 112 on a position located immediately above the same.

According to the first embodiment, further, the reflecting layer 105 has a through-port 115 passing through the reflecting layer 105 in the thickness direction in a portion located immediately under the transparent conductive layer 106. A conductive material constituting the first bonding layer 103 arranged under the reflecting layer 105 is embedded in the through-port 115. The through-port 115 has an annular shape as viewed from above the nitride semiconductor light-emitting device. The annular through-port 115 is preferably formed to be within the range of the current blocking region 114 as viewed from above the nitride semiconductor light-emitting device. The annular through-port 115 is preferably provided in the reflecting layer 105, so that the transparent conductive layer 106 and the first bonding layer 103 can be conducted with low resistance. The width (W1 in FIG. 1) of the annular through-port 115, not particularly restricted, can be set to 0.5 to 50 μm, for example, and is preferably 1 to 30 μm, so that the through-port 115 does not jut out from the current blocking region 114 and is formed with an excellent yield.

The nitride semiconductor light-emitting device according to the present invention preferably includes the current blocking region 114 and the through-port 115, which may be omitted, in consideration of improvement in light extraction efficiency and reduction in resistance.

Structures and materials well known in the art can be applied to the p-type nitride semiconductor layer 109, the light emitting layer 110 and the n-type nitride semiconductor layer 111 respectively. The surface of the n-type nitride semiconductor layer 111 is preferably irregularized as shown in FIG. 1, in order to improve the light extraction efficiency. The light emitting layer 110 can have a multiple quantum well structure prepared by alternately stacking well layers and barrier layers having band gaps different from each other, for example.

A surface (surface of the n-type nitride semiconductor layer 111 provided with the first electrode 112) of a nitride semiconductor layer consisting of the p-type nitride semiconductor layer 109, the light emitting layer 110 and the n-type nitride semiconductor layer 111 opposite to the side provided with the reflecting layer 105 made of dielectric materials is preferably irregularized. Thus, the light extraction efficiency can be improved. Further, the surface (surface of the p-type nitride semiconductor layer 109 provided with the reflecting layer 105 made of dielectric materials) of the nitride semiconductor layer provided with the reflecting layer 105 made of dielectric materials is preferably planarized, in consideration of improvement in reflectance.

The support substrate 101 can be prepared from Si, GaAs, SiC, GaP, a metal or an alloy, for example.

The method of manufacturing the nitride semiconductor light-emitting device shown in FIG. 1 is now described with reference to FIGS. 2 to 7. While a case of obtaining three light-emitting devices from one wafer is described with reference to FIGS. 2 to 7, the number of light-emitting devices obtained from one wafer is not particularly restricted in the present invention.

Figure 2:
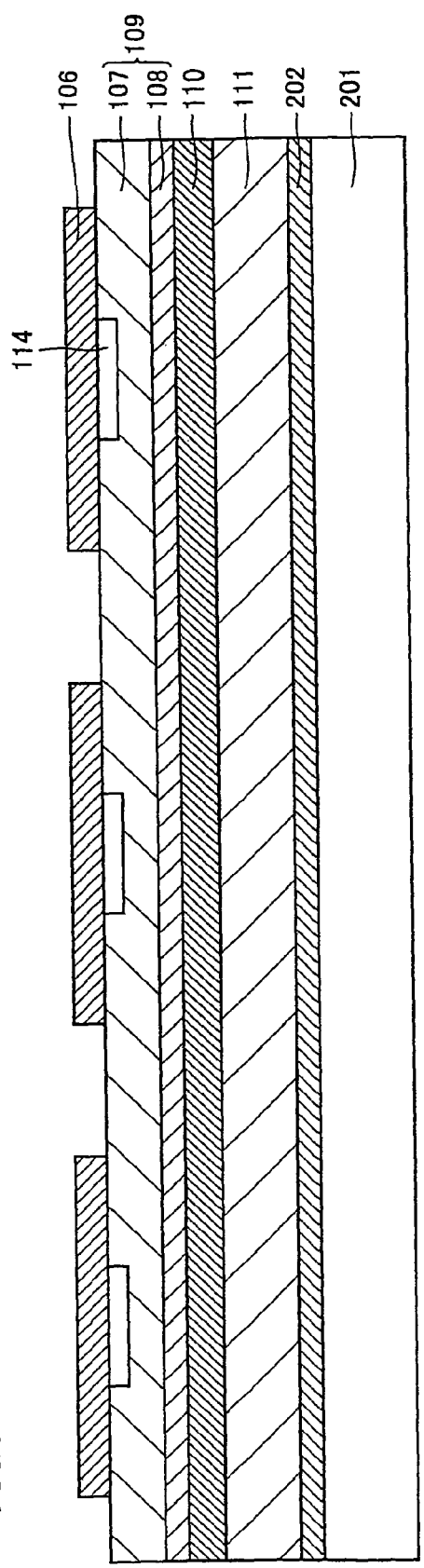
FIGS. 2 to 7 are schematic sectional views showing a method of manufacturing the nitride semiconductor light-emitting device shown in FIG. 1.

First, a buffer layer 202 made of GaN, an n-type nitride semiconductor layer 111 consisting of an n-type GaN layer, a light emitting layer 110 and a p-type nitride semiconductor layer 109 consisting of a p-type AlGaN layer 108 and a p-type GaN layer 107 are grown on a growth substrate 201 such as a sapphire substrate, an SiC substrate or a GaN substrate, for example, in this order (step (A); see FIG. 2). Metal organic chemical vapor deposition (MOCVD) or the like can be employed as the growth method. Then, a photoresist mask provided with circular openings at a constant pitch, for example, is formed on the p-type GaN layer 107, in order to form current blocking regions 114. Then, portions of the p-type GaN layer 107 exposed in the openings of the photoresist mask are increased in resistance by plasma application or the like, thereby forming the current blocking regions 114.

Then, the photoresist mask is removed, and a layer for forming transparent conductive layers 106 is thereafter stacked on the overall surface of the p-type GaN layer 107. When the transparent conductive layers 106 are made of ITO or the like, this layer can be formed by sputtering or the like. When the transparent conductive layers 106 are made of an n-type nitride semiconductor or the like, on the other hand, this layer can be formed by MOCVD or the like. Then, three photoresist masks each having a prescribed shape (square or rectangular shape, for example) are formed at a constant pitch. The photoresist masks are preferably so arranged that the central positions thereof is substantially aligned with those of the current blocking regions 114 respectively. Then, a laminate provided with the transparent conductive layers 106 at constant intervals is obtained by performing etching, as shown in FIG. 2 (step (B)).

Figure 3:
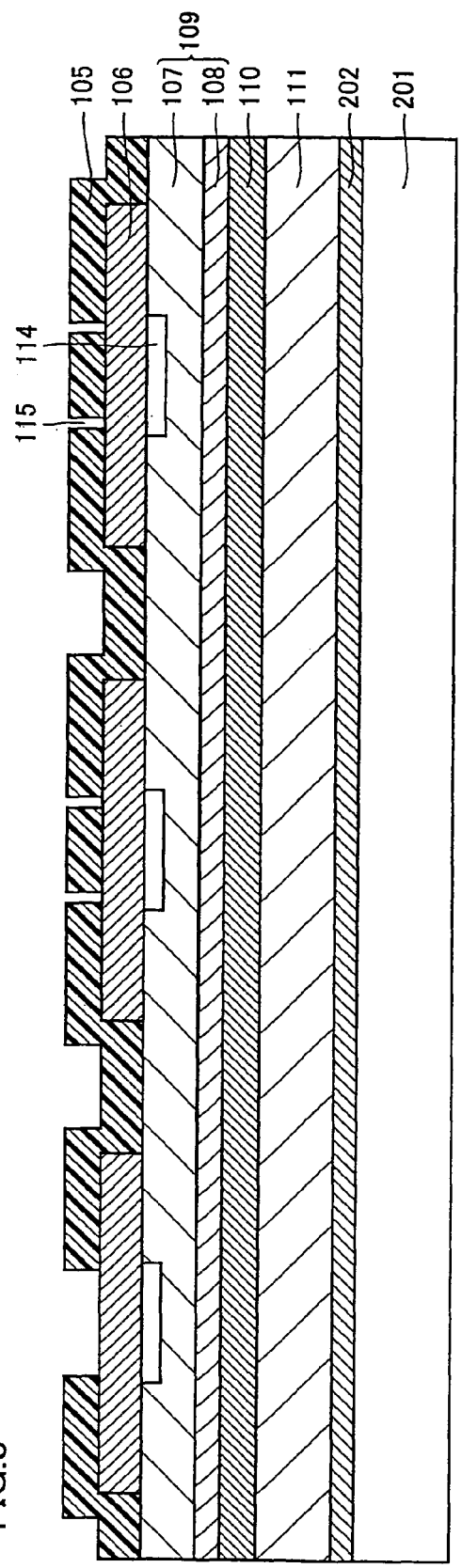

Then, the photoresist masks are removed, and a reflecting layer 105 having a multilayer structure of a layer made of a dielectric material having a high refractive index and a layer made of a dielectric material having a low refractive index, for example, is formed on the overall exposed surface of the laminate by MOCVD or the like (step (C); see FIG. 3). Then, a photoresist mask having annular openings is formed, in order to form annular through-ports 115. This photoresist mask is preferably so aligned that the annular openings are within the ranges of the current blocking regions 114. Then, portions of the reflecting layer 105 located in the openings are removed by etching to expose the transparent conductive layers 106, thereby obtaining a laminate shown in FIG. 3 (step (G)). At this time, the transparent conductive layers 106 can function as etching stopper layers when the same are formed by ITO, IZO or GaN. If no annular through-ports 115 are provided, the step (G) is unnecessary.

Figure 10:
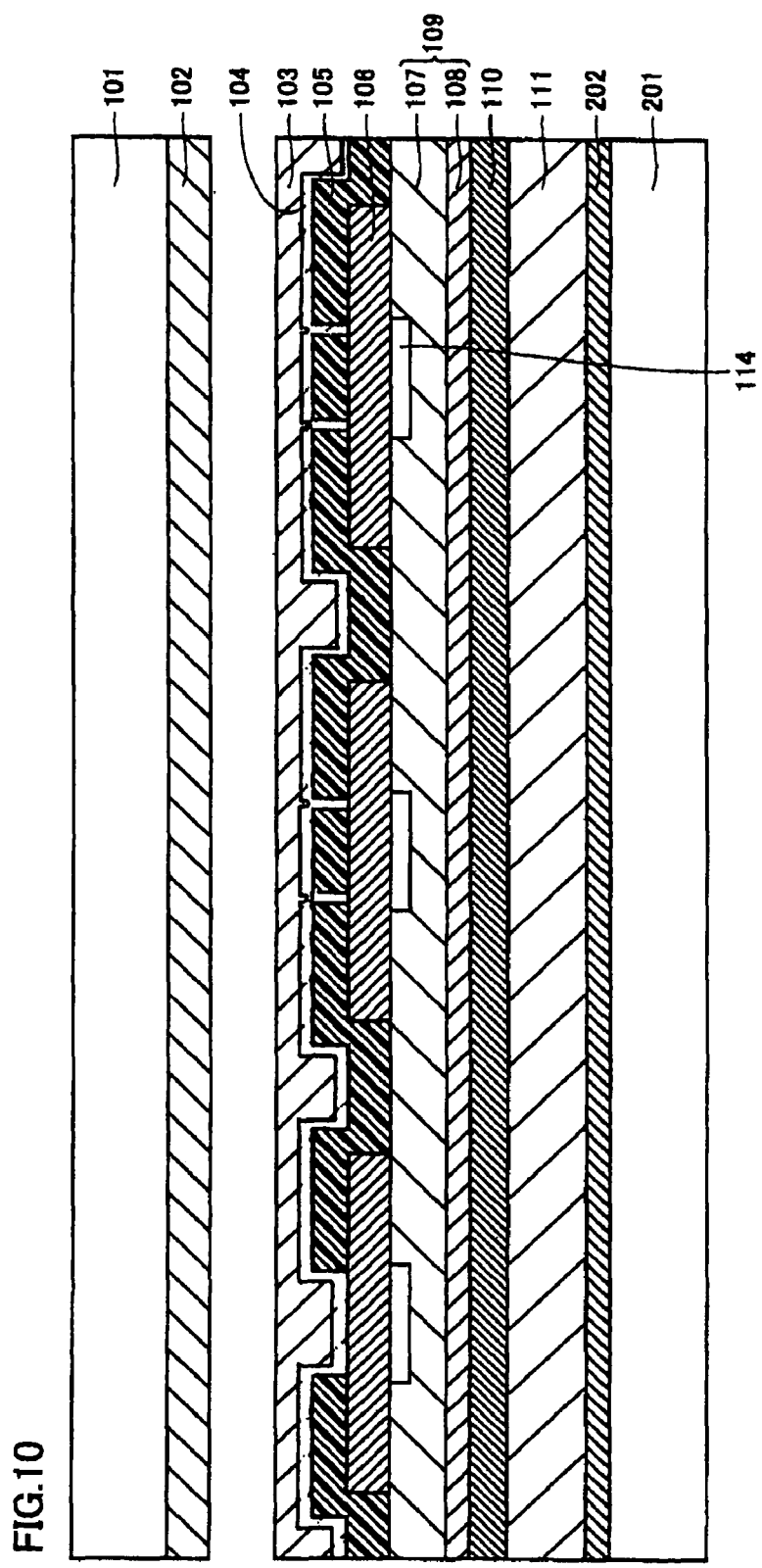
FIG. 10 is a schematic sectional view of a nitride semiconductor light-emitting device including an adhesion layer according to the present invention.

Then, the photoresist mask is removed, and a first bonding layer 103 is formed on the overall exposed surface. The first bonding layer 103 is provided in order to stack a support substrate 101 on the laminate by eutectic bonding. The first bonding layer 103 can be made of a eutectic bonding metal such as Au, AuSn, AuSi or AuGe, for example, or an alloy containing any of these materials. In order to improve adhesive strength between the first bonding layer 103 and the reflecting layer 105, an adhesion layer 104 (see FIG. 10) may be formed on the surface of the reflecting layer 105 in advance of the formation of the first bonding layer 103. The adhesion layer can be provided in a well-known structure such as a multilayer structure of a Ti layer and a Pt layer, for example.

Figure 4:
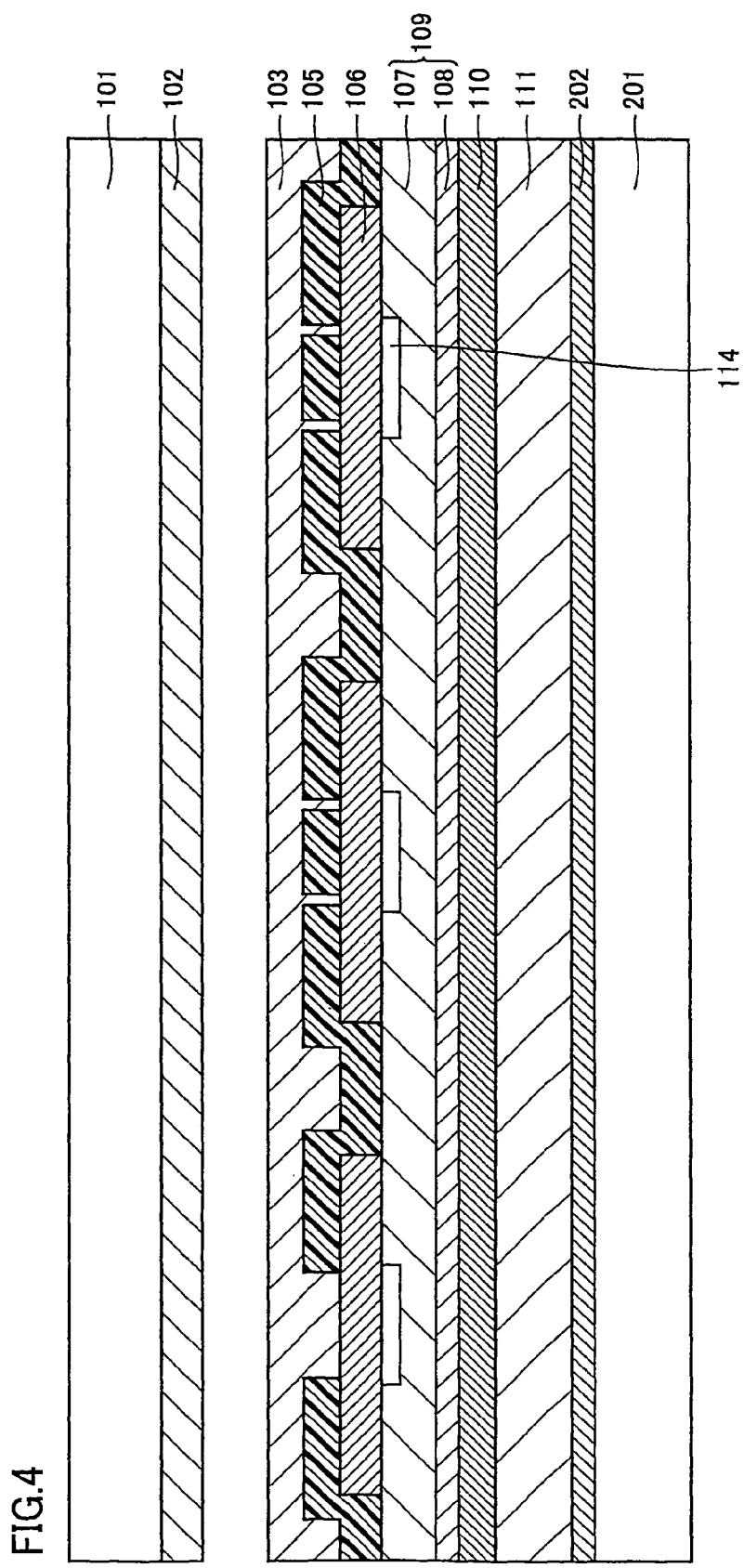

Then, the support substrate 101 is prepared, and a second bonding layer 102 is formed on the surface thereof (see FIG. 4). A eutectic bonding metal constituting the second bonding layer 102 is not particularly restricted, so far as the same is eutectic-bondable to the eutectic bonding metal constituting the first bonding layer 103. Then, the laminate having the growth substrate 201 and a laminate having the support substrate 101 are bonded to each other by eutectic-bonding the first and second bonding layers 103 and 102 to each other, so that the support substrate 101 is stacked on the laminate having the growth substrate 201 (step (D)). The eutectic bonding layer 104 shown in FIG. 1 consists of the first and second bonding layers 103 and 102.

Figure 5:
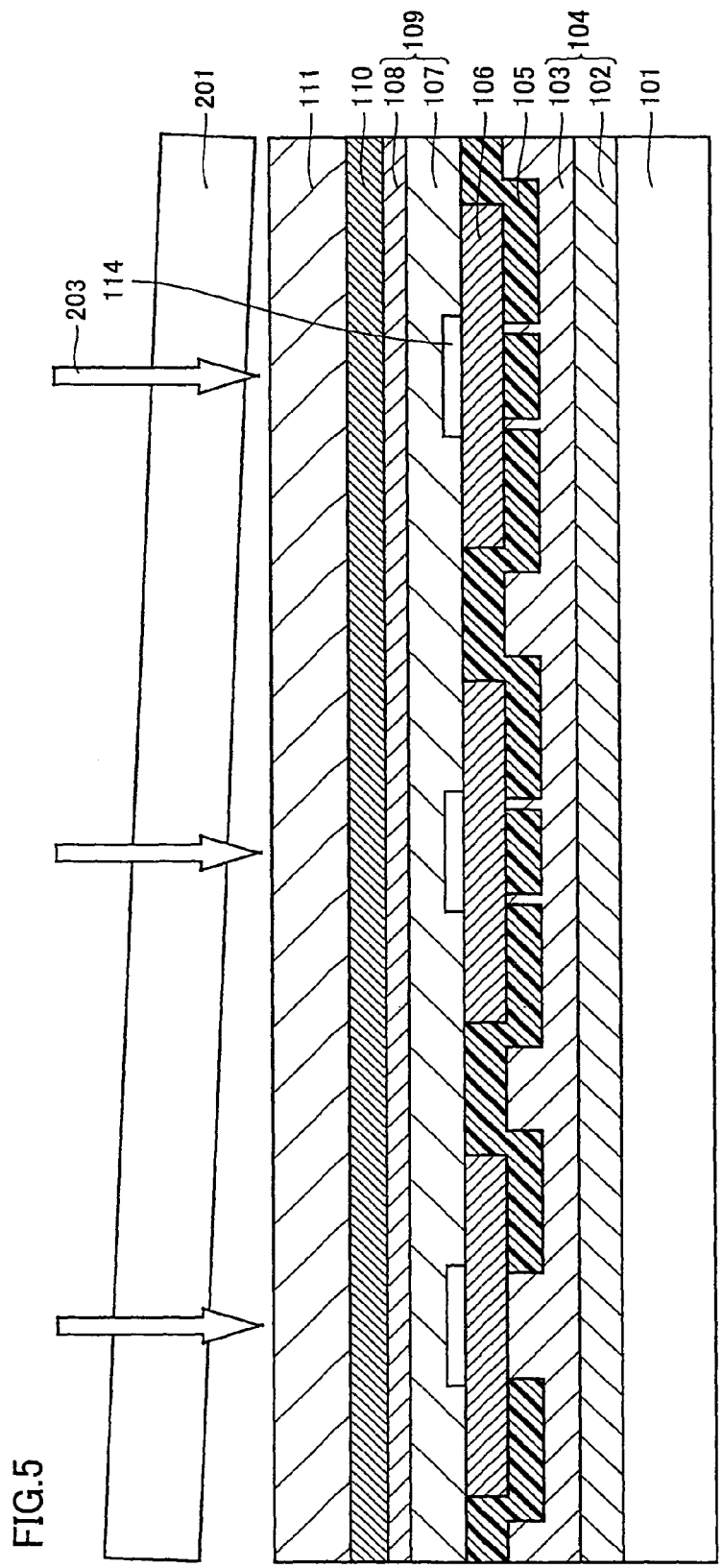

Then, the growth substrate 201 is removed (step (E); see FIG. 5). When formed by a sapphire substrate, an SiC substrate or a GaN substrate, the growth substrate 201 can preferably be separated/removed by laser separation with laser beams 203.

In a subsequent step, three photoresist masks are formed on the exposed n-type nitride semiconductor layer 111 at a constant pitch. The photoresist masks are preferably so arranged that the central positions thereof is substantially aligned with those of the transparent conductive layers 106. Then, recesses 601 are formed from the side of the n-type nitride semiconductor layer 111 by dry etching or the like, to expose the reflecting layer 105 (step (H); see FIG. 6). The recesses 601 are preferably formed in order to simplify chip division.

Figure 6:
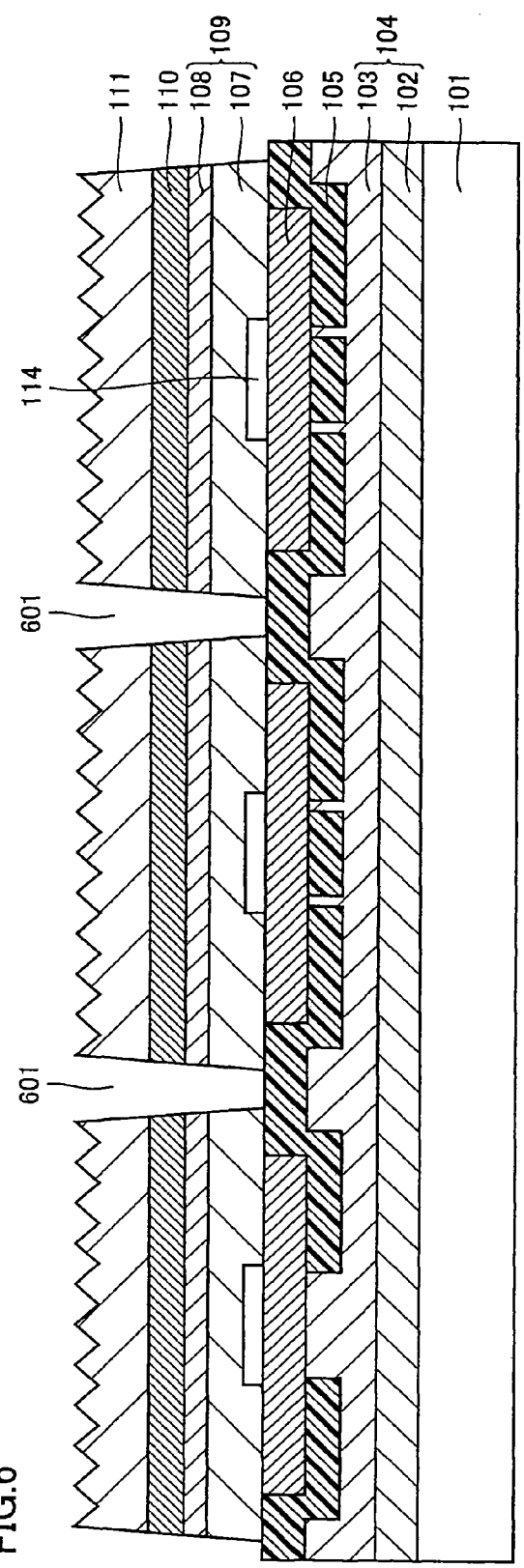
Figure 7:
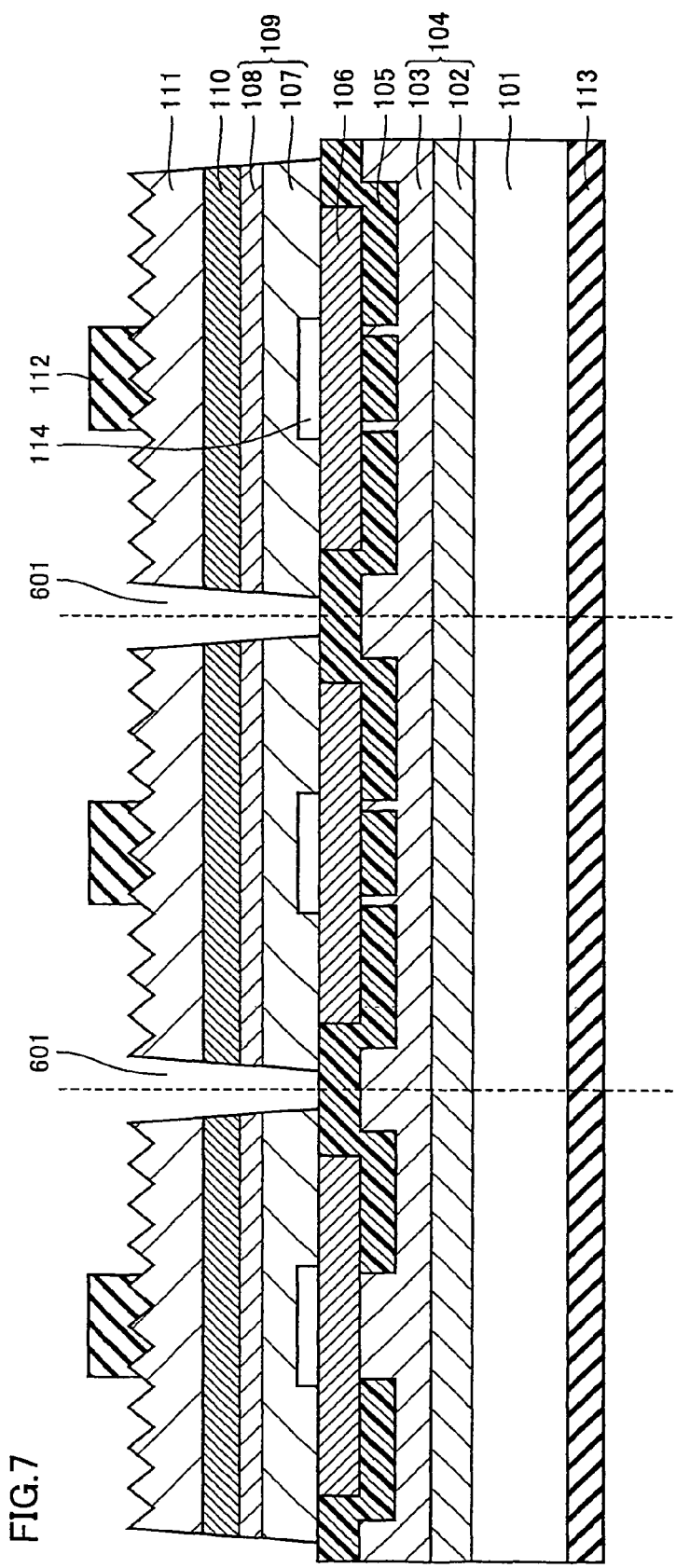

Then, the photoresist masks are removed, and the exposed surface of the n-type nitride semiconductor layer 111 is irregularized (step (I); see FIG. 6). The surface of the n-type nitride semiconductor layer 111 is not necessarily but preferably irregularized, in order to improve the light extraction efficiency. Then, first electrodes 112 are formed on the irregularized surface of the n-type nitride semiconductor layer 111, while a second electrode 113 is formed on the back surface of the support substrate 101 (see FIG. 7). The first electrodes 112 are preferably formed to be within the ranges of the current blocking regions 114, so that reduction in light extraction efficiency can be prevented. Finally, three nitride semiconductor light-emitting devices are obtained by performing chip division (step (F); see FIG. 7). The chip division is preferably performed on any positions (those of dotted lines shown in FIG. 7, for example) of the bottom surfaces of the recesses 601 (i.e., exposed surface portions of the reflecting layer 105).

<Second Embodiment>

Figure 8:
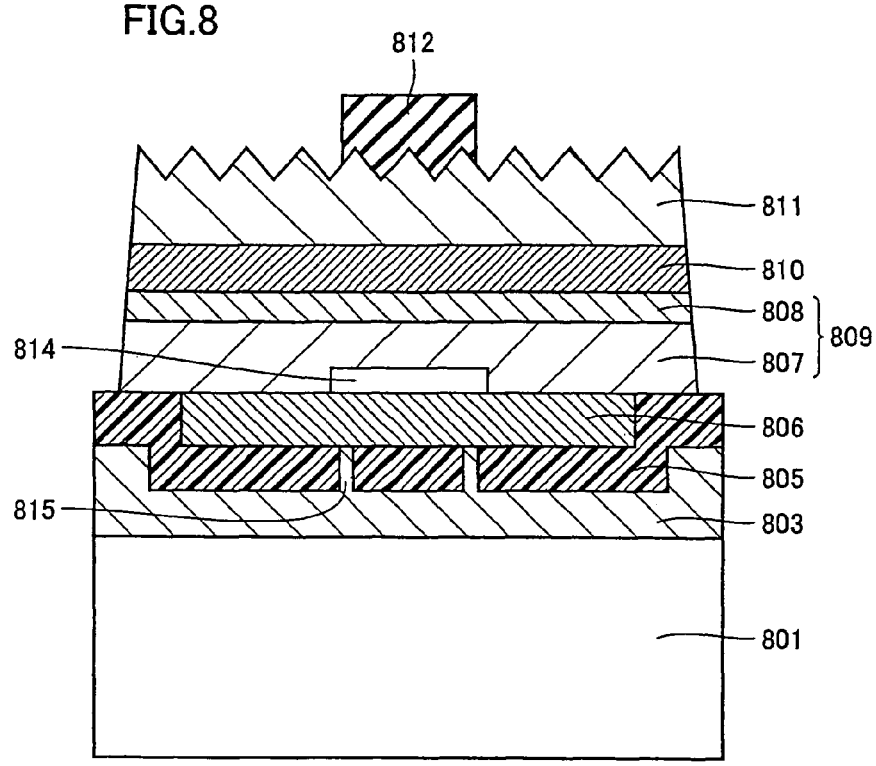
FIG. 8 is a schematic sectional view showing a second embodiment of a nitride semiconductor light-emitting device according to the present invention.

FIG. 8 is a schematic sectional view showing a second embodiment of a nitride semiconductor light-emitting device according to the present invention. The nitride semiconductor light-emitting device shown in FIG. 8 is different from the nitride semiconductor light-emitting device shown in FIG. 1 in a point employing a plating underlayer 803 and a plating layer 801 in place of the eutectic bonding layer 104, the support substrate 101 and the second electrode 113 in the nitride semiconductor light-emitting device shown in FIG. 1. In other words, the nitride semiconductor light-emitting device shown in FIG. 8 has a multilayer structure obtained by stacking the plating layer 801; the plating underlayer 803; a reflecting layer 805 made of dielectric materials; a transparent conductive layer 806; a p-type nitride semiconductor layer 809 consisting of a p-type GaN layer 807 and a p-type AlGaN layer 808; a light emitting layer 810; and an n-type nitride semiconductor layer 811 made of n-GaN in this order. A first electrode (n-side electrode) 812 is formed on the n-type nitride semiconductor layer 811. In the second embodiment, the plating layer 811 functions both as a support substrate and a p-side electrode. Therefore, the nitride semiconductor light-emitting device shown in FIG. 8 also has a vertical electrode structure. A current blocking region 814 is formed in the p-type GaN layer 807, similarly to the first embodiment. The nitride semiconductor light-emitting device having this structure can also attain effects similar to those of the first embodiment.

Also in the second embodiment, the reflecting layer 805 has an annular through-port 815, an the positional relation between the through-port 815, the current blocking region 814 and the first electrode 812 is similar to that in the first embodiment. In the second embodiment, a conductive material constituting the plating underlayer 803 is embedded in the through-port 815.

In the second embodiment, the plating underlayer 803 can be made of a well-known material such as Au, Ni, Cu, Sn, Pd, Ti or W, for example. The thickness of the plating underlayer 803 is not particularly restricted, so far as the same can fill up the annular through-port 815.

The plating layer 801 can be formed by Cu, Ni, Au or an alloy containing any of these metals, for example, and the thickness thereof can be set to 30 to 500 μm, for example, preferably 70 to 200 μm. The plating layer 801 formed by plating is so employed as the support substrate that the support substrate can be formed with an excellent yield also in a case of preparing a light-emitting device having a large area. In the case of employing the plating layer 801 as the support substrate, further, the support substrate can be directly stacked by forming the plating underlayer 803 on the reflecting layer 805 and forming the plating layer 801 thereon, more advantageously as compared with a method of forming two bonding layers, bonding the same to each other by eutectic bonding and stacking a support substrate.

EXAMPLES

While the present invention is now described in more detail with reference to Examples, the present invention is not restricted to these Examples.

Example 1

A nitride semiconductor light-emitting device having the structure shown in FIG. 1 was fabricated by the following method, as described with reference to FIGS. 2 to 7: First, a buffer layer 202 made of GaN; an n-type nitride semiconductor layer 111 consisting of an n-type GaN layer having a thickness of 4 μm; a light-emitting layer 110 (having a thickness of 100 nm) which is an MQW structure consisting of six periods of GaN barrier layer and InGaN well layer; and a p-type nitride semiconductor layer 109 consisting of a p-type AlGaN layer 108 (having a thickness of 20 nm) and a p-type GaN layer 107 (having thickness of 80 nm) were grown on a growth substrate 201 of sapphire in this order by MOCVD (step (A); see FIG. 2). Then, a photoresist mask having circular openings of 90 μm in diameter at a pitch of 400 μm was formed on the p-type GaN layer 107, in order to form current blocking regions 114. Then, portions of the p-type GaN layer 107 exposed in the openings of the photoresist mask were increased in resistance by plasma application, thereby forming the current blocking regions 114.

Then, the photoresist mask was removed, and an ITO film having a thickness of 100 nm was thereafter formed on the overall surface of the p-type GaN layer 107 by sputtering. Then, photoresist masks of 320 μm by 320 μm were formed at a pitch of 400 μm, so that the central positions thereof is substantially aligned with those of the current blocking regions 114. Then, the ITO film was etched with an etching solution containing hydrochloric acid, thereby obtaining a laminate, provided with transparent conductive layers 106, having the structure shown in FIG. 2 (step (B)).

Then, the photoresist masks were removed, and alloying was thereafter performed in an atmosphere containing oxygen, thereby activating the p-type nitride semiconductor layer 109 and reducing the resistance of and transparentizing the ITO film at the same time. Then, a reflecting layer 105 was formed by stacking seven periods of $SiO_2$ layer (76 nm thickness)/SiN layer (53 nm thickness) by MOCVD (step (C); see FIG. 3). In this step, the first $SiO_2$ layer was stacked at the start, and the seventh SiN layer was finally stacked. Then, a photoresist mask provided with annular openings (each having an outer diameter of 70 μm and a width (opening width) of 3 μm) at a pitch of 400 μm was formed on the reflecting layer 105, in order to form annular through-ports 115. At this time, the photoresist mask was so aligned that the annular openings were within the ranges of the current blocking regions 114 each having a diameter of 90 μm. Then, $SiO_2$ and SiN located in the annular openings were removed by performing dry etching with $CHF_3$ to expose the transparent conductive layers 106 made of ITO, thereby obtaining a laminate having the structure shown in FIG. 3 (step (G)). The selection ratio between $SiO_2$ and SiN, and ITO was at least 5 in the dry etching with $CHF_3$, and hence the ITO film functioned as an excellent etching stopper layer.

Then, the photoresist mask was removed, a Ti film having a thickness of 200 nm and a Pt film having a thickness of 100 nm were formed to constitute an adhesion layer, and an Au film (having a thickness of 1000 nm) was thereafter formed as a first bonding layer 103. Then, an Si substrate was prepared as a support substrate 101, and a Ti film having a thickness of 200 nm, a Pt film having a thickness of 100 nm, an Au film having a thickness of 500 nm and an AuSn film having a thickness of 3 μm were formed on the surface of the support substrate 101 in this order, thereby constituting a second bonding layer 102 (see FIG. 4). Then, the laminate having the growth substrate 201 and a laminate having the support substrate 101 were bonded to each other by eutectic-bonding the first bonding layer 103 and the second bonding layer 102 to each other by thermocompression bonding, thereby stacking the support substrate 101 on the laminate having the growth substrate 201 (step (D)).

Then, the growth substrate 201 was separated by applying laser beams 203 from the back surface of the growth substrate 201 (step (E); see FIG. 5), and a damage layer was thereafter removed from the separated surface by dry etching.

Then, photoresist masks of 340 μm by 340 μm were formed on the exposed n-type nitride semiconductor layer 111 at a pitch of 400 μm, so that the central positions thereof is substantially aligned with those of the transparent conductive layers 106. Then, recesses 601 were formed from the side of the n-type nitride semiconductor layer 111 by dry etching, to expose the reflecting layer 105 (step (H); see FIG. 6).

Then, the photoresist masks were removed, and the exposed surface of the n-type nitride semiconductor layer 111 was irregularized in the form of hexagonal pyramids with KOH (step (I); see FIG. 6). Then, first electrodes 112 of Ti/Au were formed on the irregularized surface of the n-type nitride semiconductor layer 111 by lift-off with a photoresist mask (see FIG. 7). At this time, the first electrodes 112 were formed to be within the ranges of the current blocking regions 114. The diameter of the first electrodes 112 was set to 70 μm, so that the first electrodes 112 were still within the ranges of the current blocking regions 114 having the diameter of 90 μm even if slight misalignment took place. Then, a second electrode 113 of Ti/Au was formed on the back surface of the support substrate 101 (see FIG. 7). Finally, nitride semiconductor light-emitting devices were obtained by performing chip division along positions corresponding to those shown in dotted lines in FIG. 7 (step (F); see FIG. 7).

The light output and the driving voltage of each nitride semiconductor light-emitting device according to Example 1 obtained in the aforementioned manner were 25 mW and 3.2 V respectively.

Example 2

A nitride semiconductor light-emitting device according to Example 2 was obtained similarly to Example 1, except that a reflecting layer 105 was prepared by forming three periods of SiO₂ layer (102 nm thickness)/SiN layer (72 nm thickness) and thereafter forming seven periods of SiO₂ layer (76 nm thickness)/SiN layer (53 nm thickness). The obtained nitride semiconductor light-emitting device exhibited excellent reflectance also with respect to light obliquely incident upon the reflecting layer 105, and was further improved in light extraction efficiency. The light output and the driving voltage of the nitride semiconductor light-emitting device according to Example 2 were 26 mW and 3.2 V respectively.

Example 3

A nitride semiconductor light-emitting device according to Example 3 having the structure shown in FIG. 8 was obtained by carrying out steps similar to those in Example 1 up to formation of an annular through-port 815 in a reflecting layer 805, thereafter forming an Au film having a thickness of 2 μm as a plating underlayer 803, thereafter forming a plating layer 801 of Cu having a thickness of 80 μm by electrolytic plating, and carrying out subsequent steps similarly to Example 1. The light output and the driving voltage of the nitride semiconductor light-emitting device according to Example 3 were 25 mW and 3.2 V respectively.

Example 4

Figure 9:
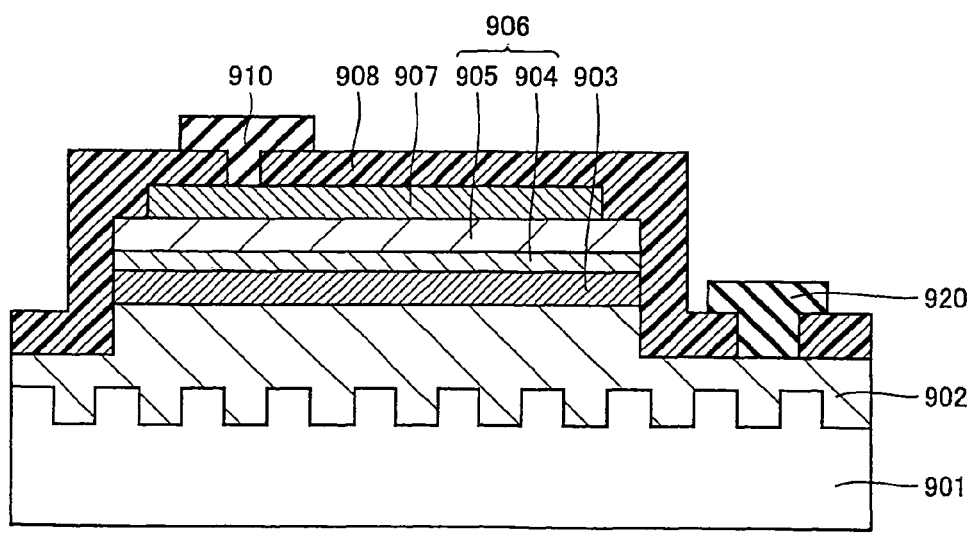
FIG. 9 is a schematic sectional view showing a nitride semiconductor light-emitting device fabricated in Example 4.

A nitride semiconductor light-emitting device according to Example 4 having a structure shown in FIG. 9 was fabricated as follows: First, a sapphire substrate having a surface irregularized in a 5 μm period of projections was prepared as a growth substrate 901. Each projection of the irregularized surface was in the form of a truncated cone having a circular bottom surface or a convex lens, and had a trapezoidal, semicircular or semielliptic sectional shape. The diameter of the projection (the length of the base of the sectional shape) was 2.5 μm. The shape and the size of the projection are not restricted to these examples. When the surface of a sapphire substrate has such a shape, the interface between the sapphire substrate and a nitride semiconductor layer formed thereon is irregularized, whereby light extraction efficiency can be improved. Further, lateral growth is prompted, threading dislocations can be suppressed, and a light-emitting device having high internal quantum efficiency can be obtained.

Then, a buffer layer (not shown) of GaN; an n-type nitride semiconductor layer 902 consisting of an n-type GaN layer having a thickness of 4 μm; a light emitting layer 903 (having a thickness of 100 nm) having an MQW structure consisting of six periods of GaN barrier layer/InGaN well layer; and a p-type nitride semiconductor layer 906 consisting of a p-type AlGaN layer 904 (having a thickness of 20 nm) and a p-type GaN layer 905 (having a thickness of 80 nm) were grown on the irregularized surface of the aforementioned sapphire substrate in this order by MOCVD.

Then, an ITO film having a thickness of 200 nm was formed on the overall surface of the p-type GaN layer 905 by sputtering. Then, a photoresist mask of about 230 μm by about 480 μm was formed at a pitch of 250 μm by 500 μm. Then, the ITO film was etched with an etching solution containing hydrochloric acid, thereby forming a transparent electrode layer 907.

Then, the aforementioned photoresist mask was removed, and alloying was thereafter performed in an atmosphere containing oxygen, thereby activating the p-type nitride semiconductor layer 906 and reducing the resistance of and transparentizing the ITO film at the same time. Then, a photoresist mask of about 240 μm by about 490 μm for mesa etching was formed at a pitch of 250 μm by 500 μm, and the p-type GaN layer 905, the p-type AlGaN layer 904, the light emitting layer 903 and the n-type nitride semiconductor layer 902 consisting of the n-type GaN layer were partially etched by dry etching, thereby partially exposing the n-type GaN layer.

Then, an SiO₂ layer having a thickness of 200 nm was formed as a part of a reflecting layer 908, thereby reducing a critical angle of total reflection. Then, four periods of SiO₂ layer having a thickness of 102 nm and SiN layer having a thickness of 72 nm were formed to increase reflectance in a direction of about 25°. Then, seven periods of SiO₂ layer having a thickness of 76 nm and SiN layer having a thickness of 53 nm were formed to maximize the reflectance in the vertical direction. The reflecting layer 908 having such a multilayer structure was so formed as to increase the quantity of totally reflected light due to the influence by the critical angle, and to increase the reflectance with respect to light emitted from the light emitting layer 903 having the MQW structure in all directions due to the combination of the periodic structure maximizing the reflectance by interference in the oblique direction of 25° and the periodic structure maximizing the reflectance in the vertical direction.

Then, a photoresist mask was formed for boring holes of about 30 μmφ in positions for forming pad electrodes 910 and 920 respectively, and SiO₂ and SiN were removed from portions not provided with the photoresist mask by performing dry etching with CHF₃ gas, thereby partially exposing the ITO film and the n-type GaN layer. The selection ratio between SiO₂ and SiN, and ITO was at least 5 in the dry etching with CHF₃, and hence the ITO film functioned as an excellent etching stopper layer. Similarly, the selection ratio between SiO₂ and SiN, and the n-type GaN layer was at least 5 in the dry etching with CHF₃, and hence the n-type GaN layer also functioned as an excellent etching stopper layer. Then, a photoresist mask for forming the pad electrodes 910 and 920 by lift-off was formed, and a Ti film having a thickness of 15 nm, an Mo film having a thickness of 20 nm and an Au film having a thickness of 500 nm were deposited and lifted off to simultaneously form the pad electrodes 910 and 920 on p- and n-sides. The light output and the driving voltage of the light-emitting device prepared in this manner were 25 mW and 3.2 V respectively.

In the light-emitting device fabricated in the aforementioned manner, an ITO electrode (transparent conductive layer 907) efficiently injects a current into the overall surface of the light-emitting device to reduce resistance while a multilayer film of SiO₂ and SiN has high reflectance, whereby light emitted from the light emitting layer 903 toward the reflecting layer 908 made of dielectric materials is efficiently reflected, efficiently extracted toward the sapphire substrate side due to the irregularized interface between the sapphire substrate and the nitride semiconductor layer, and efficiently extracted from the back surface and the side surfaces of the sapphire substrate.

In the light-emitting device according to Example 4, the sapphire substrate may be mounted on a base of a frame or the like to extract the light from the side surfaces thereof, or the pad electrodes 910 and 920 may be mounted on the base with bumps or the like as in a flip chip, to extract the light from the back surface and the side surfaces of the sapphire substrate.

In general, the size of the pad electrode must be about 80 μmφ, whether the same are wire-bonded or flip-chip-bonded with bumps or the like, depending on the size of balls in ball bonding or the bumps. In general, further, the pad electrode is made of a material such as Au having low reflectance. According to Example 4, the reflecting layer made of dielectric materials is formed between the pad electrode having low reflectance and the light emitting layer except the region of a central hole of about 30 μmϕ, whereby the light emitted from the light emitting layer toward the pad electrode is reflected by the reflecting layer made of dielectric materials except the region of the central hole of about 30 μmϕ. Therefore, light absorption by the pad electrode can be remarkably prevented.

When the chip size is reduced, most of the chip surface is covered with the pad electrode having low reflectance since the pad electrode cannot be reduced in size. Also in this case, however, a light-emitting device having high light extraction efficiency can be prepared with no influence by the pad electrode having low reflectance, due to the formation of the reflecting layer made of dielectric material.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor light-emitting device comprising:
    a reflecting layer, a transparent conductive layer, and a nitride semiconductor layer including a p-type nitride semiconductor layer, a light emitting layer and an n-type nitride semiconductor layer in this order,
    wherein said reflecting layer includes a layer having a smaller critical angle of total reflection than said transparent conductive layer at an interface with the transparent conductive layer, and
    wherein said layer having a smaller critical angle of total reflection than said transparent conductive layer has a through-port passing therethrough in a thickness direction in a region located immediately under said transparent conductive layer.

2. The nitride semiconductor light-emitting device according to claim 1, wherein said layer having a smaller critical angle of total reflection than said transparent conductive layer is made of $SiO_2$.

3. The nitride semiconductor light-emitting device according to claim 1, wherein said transparent conductive layer is made of a conductive metal oxide.

4. The nitride semiconductor light-emitting device according to claim 1, wherein said transparent conductive layer is made of an n-type nitride semiconductor.

5. The nitride semiconductor light-emitting device according to claim 1, wherein said reflecting layer has a reflectance of 80 to 100% with respect to light emitted from said light emitting layer.

6. The nitride semiconductor light-emitting device according to claim 1, wherein a first surface of the nitride semiconductor layer provided with said reflecting layer is planar.

7. The nitride semiconductor light-emitting device according to claim 1, wherein
    a second surface of the nitride semiconductor layer opposite to a first surface of the nitride semiconductor layer is irregularized.

8. The nitride semiconductor light-emitting device according to claim 1, wherein
    a length of said transparent conductive layer in a direction perpendicular to a thickness direction is smaller than a length of said p-type nitride semiconductor layer in a direction perpendicular to a thickness direction, and
    said reflecting layer is in contact with side surfaces of said transparent conductive layer and a surface of said p-type nitride semiconductor layer closer to said reflecting layer and further in contact with a part of a surface of said p-type nitride semiconductor layer closer to said transparent conductive layer, said part of a surface being not in contact with said transparent conductive layer.

9. The nitride semiconductor light-emitting device according to claim 1, wherein a thickness of said reflecting layer is 0.2 to 5 μm.

10. The nitride semiconductor light-emitting device according to claim 1, further comprising:
    a support substrate,
    wherein said support substrate, said reflecting layer, said transparent conductive layer, said p-type nitride semiconductor layer, said light emitting layer, and said n-type nitride semiconductor layer are disposed in this order.

11. The nitride semiconductor light-emitting device according to claim 10, further comprising:
    a eutectic bonding layer having a single- or multilayer structure made of a metal including a eutectic bonding metal or an alloy containing said metal between said support substrate and said reflecting layer.

12. The nitride semiconductor light-emitting device according to claim 11, further comprising:
    an adhesion layer between said reflecting layer and said eutectic bonding layer.

13. The nitride semiconductor light-emitting device according to claim 10, wherein said support substrate is a substrate made of a plated metal or alloy.

14. A method of manufacturing the nitride semiconductor light-emitting device according to claim 10, the method comprising:
    (A) stacking said n-type nitride semiconductor layer, said light emitting layer, and said p-type nitride semiconductor layer on a growth substrate in this order;
    (B) forming said transparent conductive layer on the surface of said p-type nitride semiconductor layer;
    (C) forming said reflecting layer on an exposed surface of an obtained laminate;
    (D) stacking said support substrate;
    (E) removing said growth substrate; and
    (F) obtaining a plurality of nitride semiconductor light-emitting devices by performing chip division.

15. The method of manufacturing the nitride semiconductor light-emitting device according to claim 14, further comprising:
    (G) partially exposing said transparent conductive layer by forming a through-port passing through said reflecting layer in the thickness direction in said reflecting layer after step (C).

16. The method of manufacturing the nitride semiconductor light-emitting device according to claim 15, wherein said through-port is formed by etching and said transparent conductive layer functions as an etching stopper layer in step (G).

17. The method of manufacturing a nitride semiconductor light-emitting device according to claim 14, further comprising:
    (H) exposing said reflecting layer by forming recesses substantially at a constant interval from a side of said n-type nitride semiconductor layer between steps (E) and (F).

18. The method of manufacturing a nitride semiconductor light-emitting device according to claim 17, wherein said chip division is performed on positions on bottom surfaces of said recesses in step (F).

19. The method of manufacturing a nitride semiconductor light-emitting device according to claim 14, further comprising:
    (I) irregularizing a surface of said n-type nitride semiconductor layer after step (E).

20. A nitride semiconductor light-emitting device comprising:
- a reflecting layer, a transparent conductive layer, and a nitride semiconductor layer including a p-type nitride semiconductor layer, a light emitting layer, and an n-type nitride semiconductor layer in this order,
- wherein said reflecting layer includes a layer having a smaller critical angle of total reflection than said transparent conductive layer at an interface with the transparent conductive layer side, and
- wherein said p-type nitride semiconductor layer includes a current blocking region formed in contact with said transparent conductive layer.

21. The nitride semiconductor light-emitting device according to claim 20, wherein
- said reflecting layer has a through-port passing through said reflecting layer in a thickness direction in a region located immediately under said transparent conductive layer, and
- said through-port provided in said reflecting layer is positioned immediately under said current blocking region.

22. A nitride semiconductor light-emitting device comprising:
- a growth substrate, an n-type nitride semiconductor layer, a light emitting layer, a p-type nitride semiconductor layer, a transparent conductive layer, and a reflecting layer in this order,
- wherein said reflecting layer includes a layer having a smaller critical angle of total reflection than said transparent conductive layer at an interface with the transparent conductive layer, and
- wherein said layer having a smaller critical angle of total reflection than said transparent conductive layer has a through-port passing therethrough in a thickness direction in a region located immediately under said transparent conductive layer.

23. The nitride semiconductor light-emitting device according to claim 22, wherein said growth substrate is a sapphire substrate having an irregularized surface.

* * * * *